United States Patent
Min

(10) Patent No.: US 9,945,911 B2
(45) Date of Patent: Apr. 17, 2018

(54) APPARATUS AND METHOD FOR MEASURING IMPEDANCE FOR FUEL CELL DIAGNOSIS

(71) Applicant: Hyundai Autron Co., Ltd., Seongnam-si (KR)

(72) Inventor: Tae Hong Min, Seongnam-si (KR)

(73) Assignee: Hyundai Autron Co., Ltd., Seongnam-si (KR)

(*) Notice: Subject to any disclaimer, the term of this patent is extended or adjusted under 35 U.S.C. 154(b) by 79 days.

(21) Appl. No.: 14/968,307

(22) Filed: Dec. 14, 2015

(65) Prior Publication Data
US 2016/0169979 A1 Jun. 16, 2016

(30) Foreign Application Priority Data
Dec. 15, 2014 (KR) .................. 10-2014-0180411

(51) Int. Cl.
  *G01N 27/416* (2006.01)
  *G01R 31/36* (2006.01)
  *H01M 8/04537* (2016.01)

(52) U.S. Cl.
  CPC .... *G01R 31/3662* (2013.01); *H01M 8/04559* (2013.01); *H01M 8/04589* (2013.01); *H01M 8/04649* (2013.01)

(58) Field of Classification Search
  CPC ............................................... H01M 8/04634
  USPC ...................................................... 324/430
  See application file for complete search history.

(56) References Cited

U.S. PATENT DOCUMENTS

2013/0103224 A1* 4/2013 Egami ...................... G05F 1/66
  700/297
2014/0188414 A1* 7/2014 Jeong ................ H01M 8/04649
  702/63

FOREIGN PATENT DOCUMENTS

| DE | 11 2006 001 747 T5 | 5/2008 |
|---|---|---|
| DE | 10 2011 005 966 A1 | 9/2012 |
| DE | 10 2013 226 823 A1 | 7/2014 |
| JP | 2014-53182 A | 3/2014 |
| KR | 10-2005-0012151 A | 1/2005 |
| KR | 10-2008-0018217 A | 2/2008 |
| KR | 10-2012-0037837 A | 4/2012 |
| KR | 10-1396625 B1 | 5/2014 |
| KR | 10-2014-0085802 A | 7/2014 |

OTHER PUBLICATIONS

Nobuyuki Kitamura et al., Development of Water Content Control System for Fuel Cell Hybrid Vehicles Based on AC Impedance, SAE international, 2010-01-1088, Apr. 12, 2010, Warendale, PA, USA.

* cited by examiner

*Primary Examiner* — Edward Tso
*Assistant Examiner* — Ahmed Omar
(74) *Attorney, Agent, or Firm* — Morgan, Lewis & Bockius LLP

(57) ABSTRACT

An apparatus for measuring impedance for fuel cell diagnosis may include: a current measurement unit configured to measure a current flowing to a load from a fuel cell stack; a voltage measurement unit configured to measure a voltage of the fuel cell stack; and a calculation unit configured to monitor a variation of the current measured through the current measurement unit, perform a frequency analysis operation at each sampling while sampling the current and voltage of the fuel cell stack, and calculate impedance based on the analyzed voltage and current of the fuel cell stack.

9 Claims, 4 Drawing Sheets

APPARATUS AND METHOD FOR MEASURING IMPEDANCE FOR FUEL CELL DIAGNOSIS

CROSS-REFERENCES TO RELATED APPLICATIONS

The present application claims priority to Korean application number 10-2014-0180411, filed on Dec. 15, 2014, which is incorporated by reference in its entirety.

BACKGROUND OF THE INVENTION

The present invention relates to an impedance measuring apparatus and method for measuring impedance for fuel cell diagnosis, and more particularly, to an apparatus and method for measuring impedance for fuel cell diagnosis, which monitors a current flowing through a load, and performs frequency analysis between sampling cycles while sampling the current and voltage of a fuel cell stack, when the current flowing through the load is varied by a preset value or more, thereby shortening a time required for separate frequency analysis after sampling and reducing the number of separate current injection circuits.

In general, a fuel cell is a kind of generator which does not convert chemical energy of fuel into heat through combustion, but converts the chemical energy into electrical energy through an electrochemical reaction inside a stack.

Such a fuel cell may not only supply power for industrial use, power for domestic use, and power for vehicle operation, but also supply power to small-sized electric/electronic products.

For example, much research has been conducted on PEMFC (Polymer Electrolyte Membrane Fuel Cell or Proton Exchange Membrane Fuel Cell) having the highest power density among fuel cells serving as power supply sources for vehicle operation. Since the PEMFC has a low operating temperature, the PEMFC has a fast starting time and a fast power conversion reaction time.

The PEMFC includes an MEA (Membrane Electrode Assembly), a GDL (Gas Diffusion Layer), a gasket and coupling mechanism, and a bipolar plate. The MEA has a catalyst electrode layer attached at both sides of a solid polymer electrolyte membrane through which hydrogen ions are moved, and an electrochemical reaction occurs in the catalyst electrode layer. The GDL serves to uniformly distribute reaction gases and transmit generated electrical energy. The gasket and coupling mechanism serves to maintain a sealing property for reaction gases and cooling water and a proper clamping pressure. The bipolar plate serves to move the reaction gases and cooling water.

When such a unit cell configuration is used to assemble a fuel cell stack, a combination of the MEA and the GDL is positioned at the innermost part of the unit cell. The MEA has a catalyst electrode layers formed on both surfaces of the polymer electrolyte membrane, that is, an anode and cathode, the catalyst electrode layers being coated with a catalyst which can react with hydrogen and oxygen. Outside the anode and cathode, the GDL and the gasket are stacked.

Outside the GDL, the bipolar plate is positioned. The bipolar plate has a flow field to which reaction gas is supplied and through which cooling water is passed, the reaction gas containing hydrogen serving as fuel and air or oxygen serving as an oxidizer.

Such a configuration is set to a unit cell. After a plurality of unit cells are stacked, a current collector, an insulating plate, and an end plate for supporting the stacked cells are coupled to the outermost part. Between the respective end plates, the unit cells are repetitively stacked and coupled to form the fuel cell stack.

In order to obtain a potential required by an actual vehicle, a plurality of unit cells corresponding to the required potential must be stacked. The unit cells are stacked to form a fuel cell stack.

The potential generated from one unit cell is about 1.3V. For example, a plurality of cells is stacked in series to produce power required for driving the vehicle.

Since a fuel cell used for a vehicle requires stability, failure diagnosis needs to be accurately and rapidly performed.

Examples of the method for diagnosing a fuel cell may include a cell voltage measurement method, EIS (Electrochemical Impedance Spectroscopy), a nonlinear response method, and a current interrupt method.

The cell voltage measurement method measures the voltages of all cells forming a fuel cell stack, and determines that a failure occurred when one or more cells and another cell have a large potential difference therebetween.

The EIS changes a frequency through a method of calculating an internal parameter of a system model, and uses impedance obtained by measuring an output voltage based on a small AC current.

The nonlinear response method diagnoses a failure by determining the linearity of a fuel cell system model. Similar to the EIS, the nonlinear response method measures an output voltage based on an AC current, calculates a high-frequency distortion factor of the measured voltage, and determines the linearity of the system model, in order to diagnose a failure.

The current interrupt method passes a constant current to a current cell, and instantly interrupts the current. Then, the current interrupt method calculates internal resistance based on the voltage change.

Among the methods, the cell voltage measurement method can accurately distinguish between abnormal cells and normal cells, because the cell voltages of all cells within the fuel cell stack are monitored. However, since a fuel cell stack for a vehicle includes about 400 or more cells, the configuration may become complex and the price competitiveness and reliability thereof may be degraded, when all of the cells are connected to a harness in order to measure voltages.

The nonlinear response method has a simpler system configuration than the cell voltage measurement method. However, the nonlinear response method requires complex operations during failure diagnosis through harmonic analysis for an output voltage, and requires complex control and much cost when generating a sine-wave alternating current.

Furthermore, the EIS, the current interrupt method, and the nonlinear response method change the state of a fuel cell by injecting or attracting a specific voltage/current to or from the fuel cell. Thus, the EIS, the current interrupt method, and the nonlinear response method may have difficulties during vehicle operation, and affect the operation and performance of the fuel cell.

The related art of the present invention is disclosed in Korean Patent Laid-open Publication No. 10-2014-0085802 published on Aug. 8, 2014 and entitled "Method and system for measuring impedance for state diagnosis of fuel cell stack".

BRIEF SUMMARY

Embodiments of the present invention are directed to an apparatus and method for measuring impedance for fuel cell diagnosis, which monitors a current flowing through a load, and performs frequency analysis between sampling cycles while sampling the current and voltage of a fuel cell stack, when the current flowing through the load is varied by a preset value or more, thereby shortening a time required for separate frequency analysis after sampling and reducing the number of separate current injection circuits.

In one embodiment, an apparatus for measuring impedance for fuel cell diagnosis may include: a current measurement unit configured to measure a current flowing to a load from a fuel cell stack; a voltage measurement unit configured to measure a voltage of the fuel cell stack; and a calculation unit configured to monitor a variation of the current measured through the current measurement unit, perform a frequency analysis operation at each sampling while sampling the current and voltage of the fuel cell stack, and calculate impedance based on the analyzed voltage and current of the fuel cell stack.

The calculation unit may receive the current flowing to the load from the fuel cell stack, measured by the current measurement unit, and sample the current and voltage of the fuel cell stack when a difference between the current inputted at the current cycle and the current inputted at the previous cycle is equal to or more than a preset value according to the cycle at which the variation of the current is determined.

The calculation unit may perform a frequency analysis operation on one or two frequencies.

The calculation unit may add the result of the frequency analysis operation to the previous result at each sampling, while sampling the current and voltage of the fuel cell stack.

The calculation unit may perform the frequency analysis operation by performing DFT (Discrete Fourier Transform) by one step at each sampling, while sampling the current and voltage of the fuel cell stack.

In another embodiment, a method for measuring impedance of fuel cell diagnosis may include: receiving, by a calculation unit, a current from a current measurement unit, the current flowing to a load from a fuel cell stack; determining, by the calculation unit, a variation of the received current; performing, by the calculation unit, a frequency analysis operation at each sampling, while sampling the current and voltage of the fuel cell stack by a preset sampling number according to the variation of the current; and calculating, by the calculation unit, impedance of the fuel cell stack based on the analyzed current and voltage of the fuel cell stack, when the sampling is completed.

In the determining of the variation of the received current, the calculation unit may receive the current flowing to the load from the fuel cell stack, measured by the current measurement unit, compare a difference between the current inputted at the current cycle and the current inputted at the previous cycle to a preset value according to the cycle at which the variation of the current is determined, and determine the variation of the current.

The performing of the frequency analysis calculation may include performing the frequency analysis operation on one or two frequencies.

In the performing of the frequency analysis operation, the calculation unit may add the result of the frequency analysis operation to the previous result at each sampling, while sampling the current and voltage of the fuel cell stack.

In the performing of the frequency analysis operation, the calculation unit may perform the frequency analysis operation by performing DFT by one step at each sampling, while sampling the current and voltage of the fuel cell stack.

DETAILED DESCRIPTION

Embodiments of the invention will hereinafter be described in detail with reference to the accompanying drawings. It should be noted that the drawings are not to precise scale and may be exaggerated in thickness of lines or sizes of components for descriptive convenience and clarity only. Furthermore, the terms as used herein are defined by taking functions of the invention into account and can be changed according to the custom or intention of users or operators. Therefore, definition of the terms should be made according to the overall disclosures set forth herein.

Figure 1:
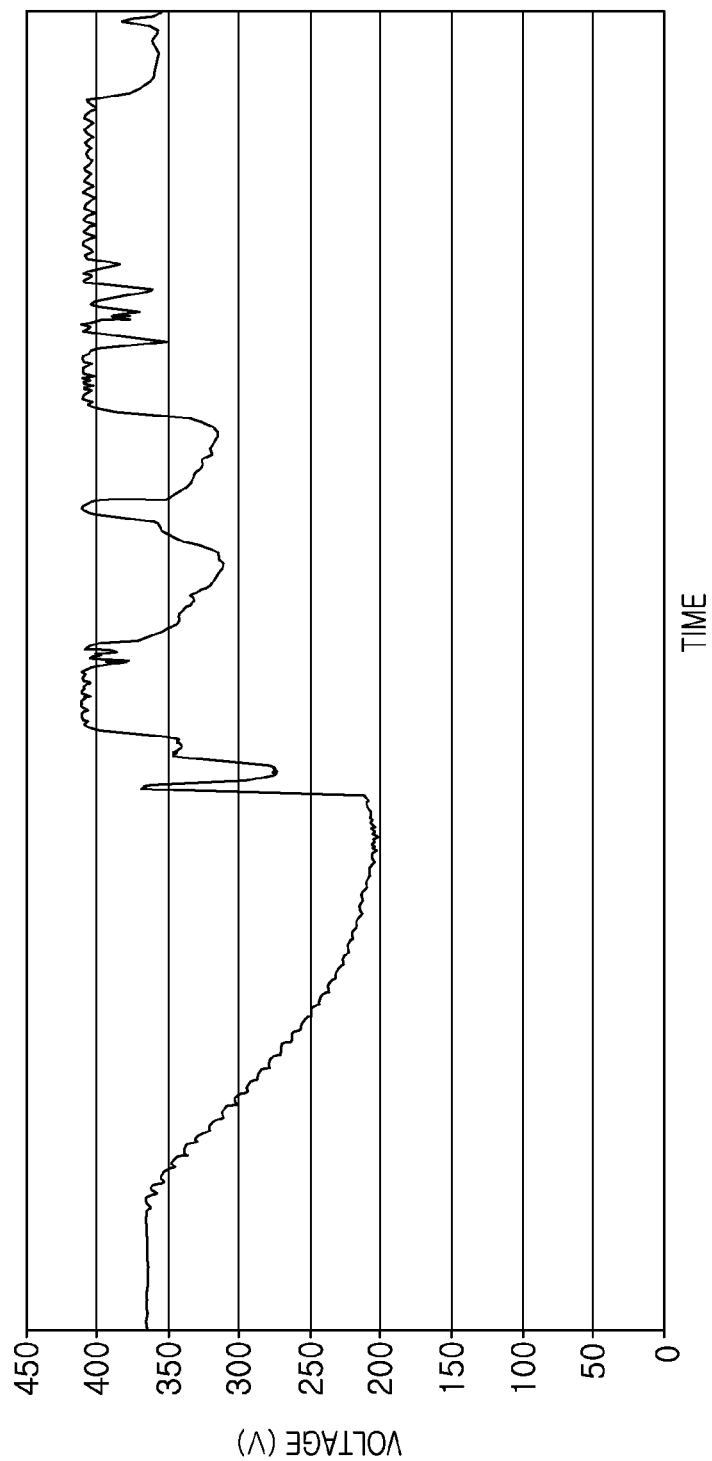
FIG. 1 is a graph illustrating voltage variations based on the load state of a fuel cell stack in accordance with an embodiment of the present invention.
Figure 2:
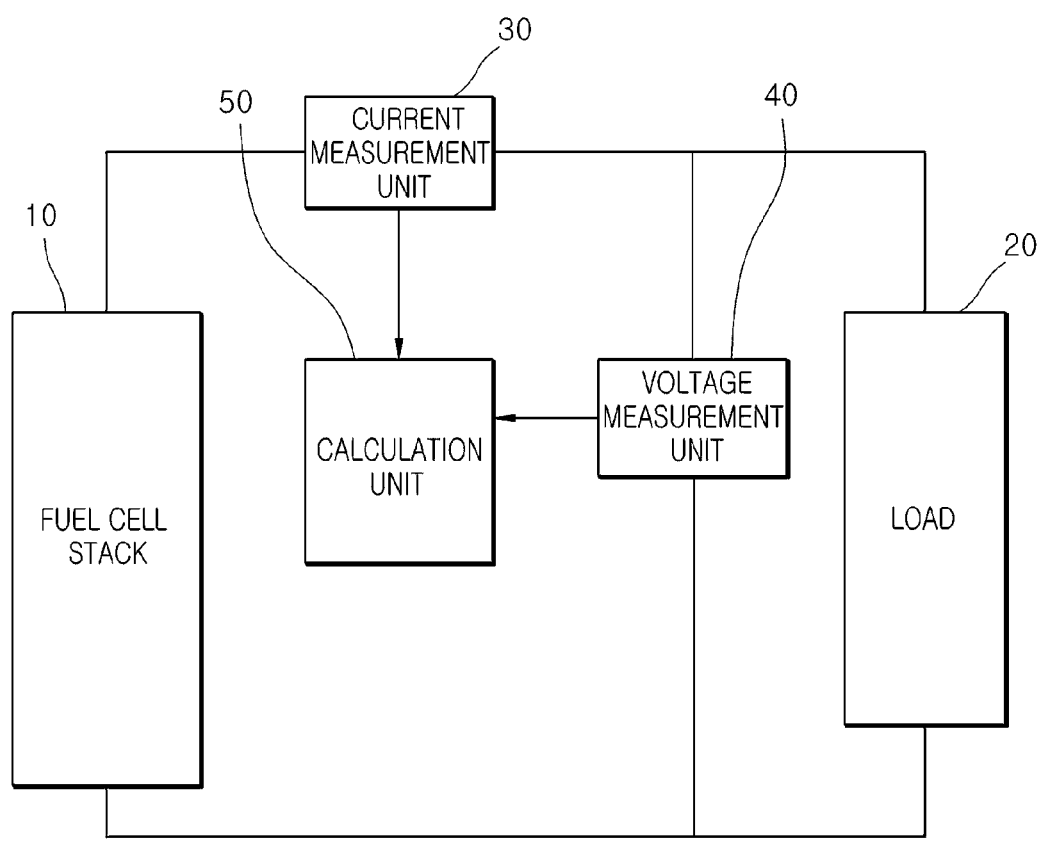
FIG. 2 is a block diagram illustrating an apparatus for measuring impedance for fuel cell diagnosis in accordance with the embodiment of the present invention.
Figure 3:
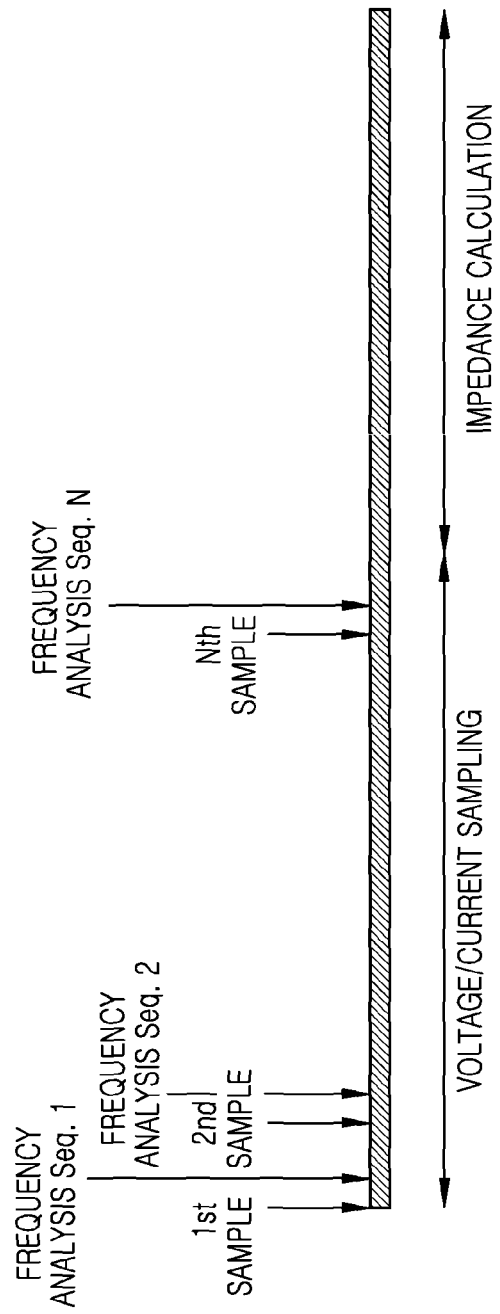
FIG. 3 is a graph illustrating an impedance measurement sequence in the apparatus for measuring impedance for fuel cell diagnosis in accordance with the embodiment of the present invention.

FIG. 1 is a graph illustrating voltage variations based on the load state of a fuel cell stack in accordance with an embodiment of the present invention. FIG. 2 is a block diagram illustrating an apparatus for measuring impedance for fuel cell diagnosis in accordance with the embodiment of the present invention. FIG. 3 is a graph illustrating an impedance measurement sequence in the apparatus for measuring impedance for fuel cell diagnosis in accordance with the embodiment of the present invention.

As illustrated in FIG. 2, the apparatus for measuring impedance for fuel cell diagnosis in accordance with the embodiment of the present invention may include a current measurement unit 30, a voltage measurement unit 40, and a calculation unit 50.

The current measurement unit 30 may measure a current flowing to a load 20 from a fuel cell stack 10, and provide the measured current to the calculation unit 50.

The voltage measurement unit 40 may measure the voltage of the fuel cell stack 10, and provide the measured voltage to the calculation unit 50.

The calculation unit 50 may monitor variations of the current measured by the current measurement unit 30. When the current is varied by a preset value or more, the calculation unit 50 may sample the current and voltage of the fuel cell stack 10.

In general, the impedance of a fuel cell is measured in a state where an AC current is injected to the fuel cell to change an output voltage.

However, the apparatus for measuring impedance for fuel cell diagnosis in accordance with the embodiment of the present invention may use the property that the voltage of the fuel cell is varied as illustrated in FIG. 1, when current consumption of the load 20 such as a motor used in the vehicle is changed.

Thus, although an AC current is not separately injected to measure the impedance of the fuel cell, the calculation unit 50 may determine the variations of the current flowing through the load while monitoring the current. When the current is varied by the preset value or more, the calculation unit 50 may perform a sampling operation for measuring impedance.

That is, when a difference between a current inputted at the current cycle and a current inputted at the previous cycle is equal to or more than the preset value, the calculation unit 50 may determine that the current was varied, and perform a sampling operation for measuring impedance. The cycle may refer to a cycle at which variations of a current are determined.

Then, the calculation unit 50 may add a result value obtained by performing a frequency analysis operation to the previous result value, during each sampling. When the preset number of samples is satisfied, the calculation unit 50 may calculate impedance.

That is, when sampling is performed according to the impedance measurement sequence illustrated in FIG. 3, the calculation unit 50 may perform a frequency analysis operation during a spare time from the point of time that the sampling is performed to the point of time that the next sampling is performed. Thus, the calculation unit 50 can omit the time required for collecting the sampled currents and voltages and performing a frequency analysis operation, after the sampling is ended.

At this time, the calculation unit 50 may perform DFT (Discrete Fourier Transform) of Equation 1 by one step whenever sampling is performed, and add the results, in order to perform the frequency analysis operation.

In the present embodiment, since only one or two frequency components are required for impedance calculation, the calculation unit 50 may not use FFT (Fast Fourier Transform), but use the DFT to perform a frequency analysis operation. Then, the operation speed can be improved.

$$IF = \sum_{n=1}^{N} (Ic(n) * \sin(2\pi Fn) + Ic(n) * j\cos(2\pi Fn))$$ [Equation 1]

$$VF = \sum_{n=1}^{N} (Vc(n) * \sin(2\pi Fn) + Vc(n) * j\cos(2\pi Fn))$$

In Equation 1, IF represents the current spectrum magnitude of a frequency F, VF represents the voltage spectrum magnitude of the frequency F, Ic(n) represents the current of the fuel cell stack at n-th sampling, and Vc(n) represents the voltage of the fuel cell stack at the n-th sampling.

As such, whenever the current and voltage of the fuel cell stack 10 are sampled, the calculation unit 50 may perform a frequency analysis operation at each sampling, and add the current analysis result and the previous analysis result. Then, when the preset number of samples is satisfied, the calculation unit 50 can obtain a current spectrum magnitude and a voltage spectrum magnitude for the preset sample number. Thus, the calculation unit 50 may calculate impedance through Equation 2, based on the analyzed current and voltage.

$$R = \frac{IF}{VF}$$ [Equation 2]

The calculated impedance may be notified to a control unit (not illustrated), and the control unit may determine whether the impedance deviates from a preset range, in order to diagnose the fuel cell.

As described above, the apparatus for measuring impedance for fuel cell diagnosis in accordance with the embodiment of the present invention may monitor a current flowing through the load. When the monitored current is varied by a preset value or more, the apparatus may perform frequency analysis between the sampling cycles while sampling the current and voltage of the fuel cell stack. Thus, the apparatus may not only reduce a time required for separate frequency analysis after the sampling is ended, but also omit a separate current injection circuit.

Figure 4:
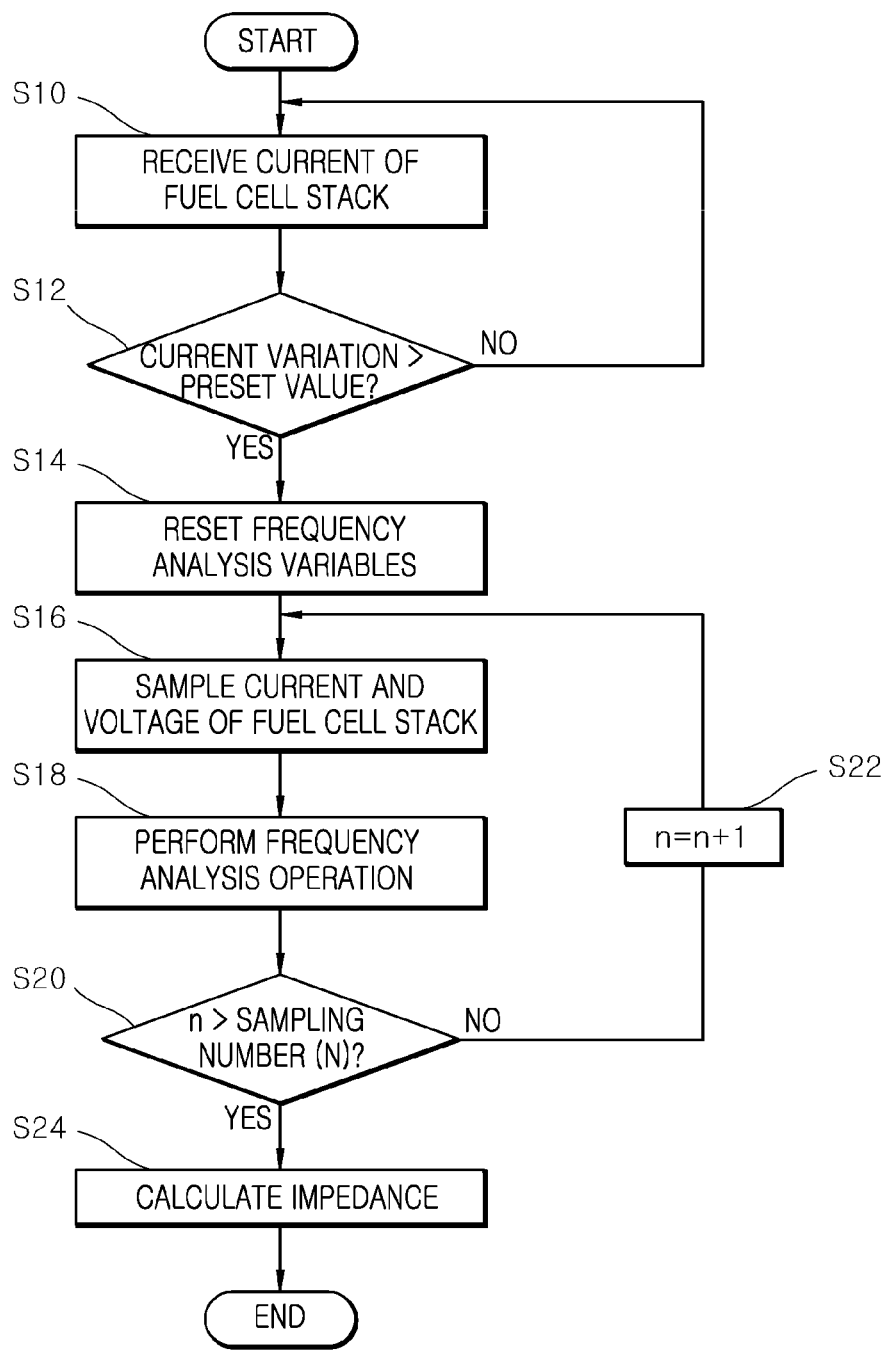
FIG. 4 is a flowchart illustrating a method for measuring impedance for fuel cell diagnosis in accordance with an embodiment of the present invention.

FIG. 4 is a flowchart illustrating a method for measuring impedance for fuel cell diagnosis in accordance with an embodiment of the present invention.

Referring to FIG. 4, the method for measuring impedance for fuel cell diagnosis in accordance with an embodiment of the present invention will be described as follows. First, the calculation unit 50 may receive a current from the current measurement unit 30, the current flowing to the fuel cell stack 10 from the fuel cell stack 10.

In general, the impedance of a fuel cell is measured in a state where an AC current is injected to the fuel cell to change an output voltage.

However, the apparatus for measuring impedance for fuel cell diagnosis in accordance with the embodiment of the present invention may use the property that the voltage of the fuel cell is varied as illustrated in FIG. 1, when current consumption of the load 20 such as a motor used in the vehicle is changed.

Then, the calculation unit 50 may determine a variation of the current flowing to the load 20 from the fuel cell stack 10, at step S12. That is, the calculation unit 50 may determine whether the current variation is equal to or more than a preset value.

At this time, when the current variation is less than the preset value, the calculation unit 50 may return to step S10. Then, the calculation unit 50 may receive the current flowing to the load 20 form the fuel cell stack 10, and monitor the current. That is, when a difference between a current inputted at the current cycle and a current inputted at the previous cycle is equal to or more than the preset value, the calculation unit 50 may determine that the current was varied.

However, when the current variation is equal to or more than the preset value at step S12, the calculation unit 50 may reset frequency analysis variables at step S14. That is, the calculation unit 50 may reset the values used during the previous frequency analysis, and set a new sampling number for sampling.

Then, the calculation unit 50 may sample the current and voltage of the fuel cell stack 10 through the current measurement unit 30 and the voltage measurement unit 40.

Then, for a frequency analysis operation, the calculation unit 50 may perform DFT of Equation 3 by one step whenever sampling is performed, and add the results, at step S18.

Then, while the current and voltage of the fuel cell stack 10 are sampled, the calculation unit 50 may perform a frequency analysis operation at each sampling, and add the current analysis result to the previous analysis result. Thus, when the preset number of samples is satisfied, the calculation unit 50 can obtain a current spectrum magnitude and a voltage spectrum magnitude for the preset sample number.

$$IF = \sum_{n=1}^{N} (Ic(n) * \sin(2\pi Fn) + Ic(n) * j\cos(2\pi Fn)) \quad \text{[Equation 3]}$$

$$VF = \sum_{n=1}^{N} (Vc(n) * \sin(2\pi Fn) + Vc(n) * j\cos(2\pi Fn))$$

In Equation 1, IF represents the current spectrum magnitude of a frequency F, VF represents the voltage spectrum magnitude of the frequency F, Ic(n) represents the current of the fuel cell stack at n-th sampling, and Vc(n) represents the voltage of the fuel cell stack at the n-th sampling.

In the present embodiment, since only one or two frequency components are required for impedance calculation, the calculation unit 50 may not use FFT, but use DFT to perform a frequency analysis operation. Then, the operation speed can be improved.

As such, the calculation unit 50 may repeat the process of sampling the current and voltage of the fuel cell stack 10 and performing the frequency analysis operation, until the sampling number reaches a preset sampling number N. At this time, while increasing the sampling number (n), the calculation unit 50 may repeat the process until the sampling number reaches N.

While repeating the process by the preset sampling number at step S20, the calculation unit 50 may perform the frequency analysis operation and add the current analysis result to the previous analysis result. Then, when the preset number of samples is satisfied, the calculation unit 50 can obtain a current spectrum magnitude and a voltage spectrum magnitude for the preset sample number. Thus, the calculation unit 50 may calculate impedance through Equation 4, based on the analyzed current and voltage, at step S24.

$$R = \frac{IF}{VF} \quad \text{[Equation 4]}$$

The calculated impedance may be notified to a control unit (not illustrated), and the control unit may determine whether the impedance deviates from a preset range, in order to diagnose the fuel cell.

As described above, the method for measuring impedance for fuel cell diagnosis in accordance with the embodiment of the present invention may monitor a current flowing through the load. When the monitored current is varied by a preset value or more, the apparatus may perform frequency analysis between the sampling cycles while sampling the current and voltage of the fuel cell stack. Thus, the method may not only reduce a time required for separate frequency analysis after the sampling is ended, but also omit a separate current injection circuit.

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. An apparatus for measuring impedance for fuel cell diagnosis, comprising:
    a current measurement unit configured to measure a current flowing to a load from a fuel cell stack;
    a voltage measurement unit configured to measure a voltage of the fuel cell stack; and
    a calculation unit configured to monitor a variation of the current measured through the current measurement unit, perform a frequency analysis operation at each sampling while sampling the current and voltage of the fuel cell stack, and calculate impedance based on the analyzed voltage and current of the fuel cell stack,
    wherein the calculation unit receives the current flowing to the load from the fuel cell stack, measured by the current measurement unit, and samples the current and voltage of the fuel cell stack when a difference between the current inputted at the current cycle and the current inputted at the previous cycle is equal to or more than a preset value according to the cycle at which the variation of the current is determined.

2. The apparatus of claim 1, wherein the calculation unit performs a frequency analysis operation on one or two frequencies.

3. The apparatus of claim 1, wherein the calculation unit adds a result of the frequency analysis operation to a previous result at each sampling, while sampling the current and voltage of the fuel cell stack.

4. The apparatus of claim 1, wherein the calculation unit performs the frequency analysis operation by performing DFT (Discrete Fourier Transform) by one step at each sampling, while sampling the current and voltage of the fuel cell stack.

5. A method for measuring impedance for fuel cell diagnosis, comprising:
    receiving, by a calculation unit, a current from a current measurement unit, the current flowing to a load from a fuel cell stack;
    determining, by the calculation unit, a variation of the received current;
    performing, by the calculation unit, a frequency analysis operation at each sampling, while sampling the current and voltage of the fuel cell stack by a preset sampling number according to the variation of the current; and
    calculating, by the calculation unit, impedance of the fuel cell stack based on the frequency analyzed current and voltage of the fuel cell stack, when the sampling is completed,
    wherein in the determining of the variation of the received current, the calculation unit receives the current flowing to the load from the fuel cell stack, measured by the current measurement unit, compares a difference between the current inputted at the current cycle and the current inputted at the previous cycle to a preset value according to the cycle at which the variation of the current is determined, and determines the variation of the current.

6. The method of claim 5, wherein the performing of the frequency analysis calculation comprises performing the frequency analysis operation on one or two frequencies.

7. The method of claim 5, wherein in the performing of the frequency analysis operation,
    the calculation unit adds a result of the frequency analysis operation to a previous result at each sampling, while sampling the current and voltage of the fuel cell stack.

8. The method of claim 5, wherein in the performing of the frequency analysis operation,
    the calculation unit performs the frequency analysis operation by performing DFT by one step at each sampling, while sampling the current and voltage of the fuel cell stack.

9. An apparatus for measuring impedance for fuel cell diagnosis, comprising:

a current measurement unit configured to measure a current flowing to a load from a fuel cell stack;

a voltage measurement unit configured to measure a voltage of the fuel cell stack; and a calculation unit configured to monitor a variation of the current measured through the current measurement unit, perform a frequency analysis operation at each sampling while sampling the current and voltage of the fuel cell stack, and calculate impedance based on the analyzed voltage and current of the fuel cell stack, wherein the calculation unit adds a result of the frequency analysis operation to a previous result at each sampling, while sampling the current and voltage of the fuel cell stack.

* * * * *